United States Patent
Behziz

(10) Patent No.: US 7,492,146 B2
(45) Date of Patent: Feb. 17, 2009

(54) IMPEDANCE CONTROLLED VIA STRUCTURE

(75) Inventor: Arash Behziz, Thousand Oaks, CA (US)

(73) Assignee: Teradyne, Inc., North Reading, MA (US)

( * ) Notice: Subject to any disclaimer, the term of this patent is extended or adjusted under 35 U.S.C. 154(b) by 97 days.

(21) Appl. No.: 11/266,892

(22) Filed: Nov. 3, 2005

(65) Prior Publication Data
US 2006/0258187 A1   Nov. 16, 2006

Related U.S. Application Data

(60) Provisional application No. 60/681,325, filed on May 16, 2005.

(51) Int. Cl.
*G01R 31/28* (2006.01)
(52) U.S. Cl. .................. 324/158.1; 324/763; 333/33
(58) Field of Classification Search ......... 324/754–765, 324/158.1; 333/33
See application file for complete search history.

(56) References Cited

U.S. PATENT DOCUMENTS

| | | | | |
|---|---|---|---|---|
| 3,775,709 A | * | 11/1973 | Firmain et al. ............ 333/252 |
| 4,080,579 A | * | 3/1978 | Fassett ..................... 333/117 |
| 4,494,083 A | * | 1/1985 | Josefsson et al. ............. 333/33 |
| 5,208,561 A | * | 5/1993 | Delestre et al. ........... 333/22 R |
| 5,525,953 A | * | 6/1996 | Okada et al. ................ 333/204 |
| 6,336,269 B1 | * | 1/2002 | Eldridge et al. ............... 29/885 |
| 6,388,206 B2 | * | 5/2002 | Dove et al. .................. 174/262 |
| 6,388,208 B1 | * | 5/2002 | Kiani et al. ................. 174/266 |
| 6,400,234 B1 | | 6/2002 | Ohhashi et al. |
| 6,501,181 B2 | * | 12/2002 | Albinsson ................... 257/774 |
| 6,541,712 B1 | * | 4/2003 | Gately et al. ................ 174/266 |
| 6,784,674 B2 | * | 8/2004 | Miller ........................ 324/754 |
| 6,856,210 B2 | * | 2/2005 | Zhu et al. ..................... 333/33 |
| 6,870,264 B2 | * | 3/2005 | Iwaki et al. ................. 257/758 |
| 7,030,712 B2 | * | 4/2006 | Brunette et al. ............... 333/33 |
| 7,053,729 B2 | * | 5/2006 | Aguirre et al. ................ 333/33 |
| 2001/0000428 A1 | * | 4/2001 | Abadeer et al. ............... 333/33 |
| 2001/0034142 A1 | | 10/2001 | Nakano et al. |
| 2001/0054939 A1 | | 12/2001 | Zhu et al. |
| 2003/0201123 A1 | | 10/2003 | Kistner |
| 2004/0217769 A1 | * | 11/2004 | DiOrio ....................... 324/754 |
| 2004/0263181 A1 | * | 12/2004 | Ye et al. ..................... 324/534 |

* cited by examiner

*Primary Examiner*—Ha Tran T Nguyen
*Assistant Examiner*—Richard Isla Rodas
(74) *Attorney, Agent, or Firm*—Christopher R. Balzan

(57) ABSTRACT

In one embodiment, a via structure for a printed circuit board is provided which includes a signal via and an elongated signal conductor strip electrically connected to the signal via. The elongated signal conductor strip is adjacent to a ground conductor and extends from the conductive pad substantially to the ground conductor. The elongated signal conductor strip includes a portion extending laterally outward, which may be configured to have a capacitance so as to establish an impedance for the via structure.

38 Claims, 7 Drawing Sheets

IMPEDANCE CONTROLLED VIA STRUCTURE

CROSS REFERENCE TO RELATED APPLICATION

This application claims the benefit of U.S. Provisional Application No. 60/681,325, filed on May 16, 2005, by Arash Behziz, entitled IMPEDANCE CONTROLLED VIA STRUCTURE, herein incorporated by reference in its entirety.

BACKGROUND

A via is an electrical interconnect that typically passes through a multi-layer printed circuit board and provides an electrical connection between layers of the printed circuit board. Generally, a via connects a trace in one layer of the printed circuit board with a trace in another layer of the printed circuit board. In turn, the traces are connected to electrical circuits, electrical devices, contact pads, connectors, etc. Further, a via itself may include a surface contact pad. In this way, the electrical circuits, electrical devices, contact pads, connectors, etc., are electrically connected to each other through the via.

Thus, a via in combination with a trace on the printed circuit board provides a signal path through the printed circuit board. For a high frequency signal, the via may exhibit transmission line characteristics that slow propagation of the high frequency signal along the signal path, and may affect the fidelity and integrity of the high frequency signal. In light of the above, there exists a need for improving the propagation rate of a high frequency signal through a via in a printed circuit board. Additionally, there exists a need for maintaining the fidelity and integrity of a high frequency signal propagating through the via.

SUMMARY

In one embodiment, a via structure for a printed circuit board includes a signal via connected to an elongated signal conductor strip. The elongated signal conductor strip has a section extending away from the signal via without an adjacent ground conductor, the section extending away extends along an axis and comprises a portion bulging laterally outward from the axis.

In another embodiment, a via structure for a printed circuit board includes a signal via electrically connected to a conductive pad. A ground conductor is positioned a keep out distance away from the conductive pad. An elongated signal conductor strip extends longitudinally along an axis from the conductive pad to adjacent the ground conductor. The elongated signal conductor strip includes a portion protruding laterally outward from the axis, the outward protruding portion is located within the keep out distance.

In another embodiment, a printed circuit board includes a first layer, a second layer, a via structure, and at least one ground via. The first layer includes a ground conductor and the second layer includes a signal trace. The via structure is electrically connected to the signal trace and includes a signal via extending at least partially through the second layer, a conductive pad in the second layer, and an elongated signal conductor strip in the second layer. The conductive pad is electrically connected to the signal via and the elongated signal conductor strip. The elongated signal conductor strip extends from the conductive pad longitudinally along an axis and includes a portion protruding laterally outward from the axis. This outward protruding portion of the elongated signal conductor strip is configured to have a capacitance so as to establish a predetermined impedance for the via structure. The ground via, electrically connected to the first ground conductor, is located about the signal via and may be positioned beyond a keep out distance away from the signal via.

One or more of the embodiments above may have one or more of the advantages below. There may be other advantages that become evident upon reading of the description. One advantage is that the via structure may be capable of transmitting a high speed signal. Another advantage is that the via structure may preserve the fidelity of a high speed signal. Yet another advantage is that the via structure may be implemented without significantly increasing cost, or manufacturing time.

BRIEF DESCRIPTION OF THE DRAWINGS

Further features and advantages of the invention may be more readily understood by reference to the following description taken in conjunction with the accompanying drawings.

DESCRIPTION

Figure 1:
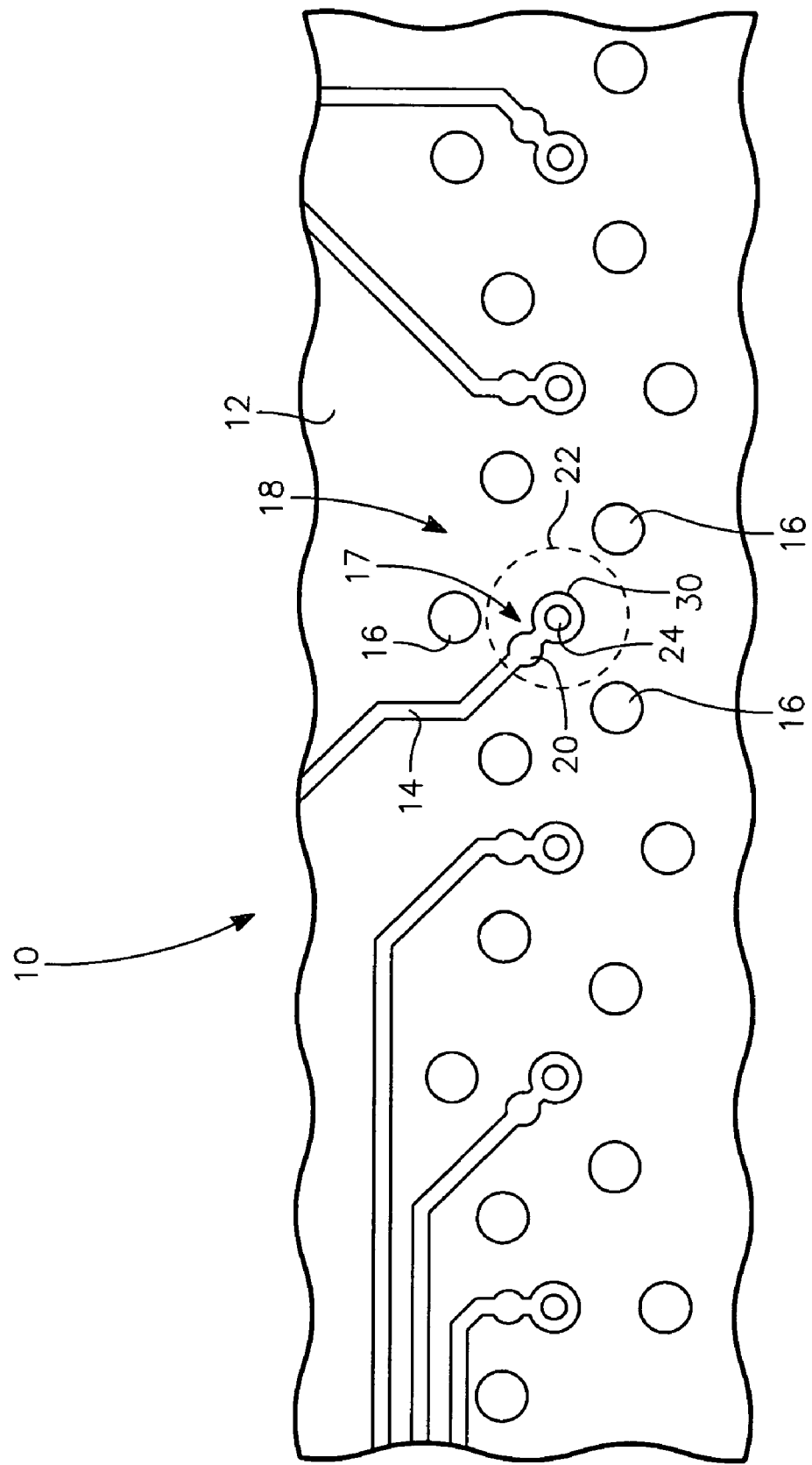
FIG. 1 is a top view of one embodiment of a printed circuit board including a via structure.

FIG. 1 depicts a top view of a printed circuit board 10 including one embodiment of a via structure 18. The via structure 18 includes a conductive pad 30 with a signal via 24 extending through a hole (not shown in FIG. 1) through the conductive pad 30. In some embodiments, the conductive pad 30 may completely surround the signal via 24 to form a ring like structure as shown in FIG. 1, or it may only partially surround (not shown) the signal via 24. The signal via 24 passes at least partially through the printed circuit board 10 and has an associated impedance.

An elongated signal conductor strip 17 extends from the conductive pad 30 and includes a bulging portion 20 protruding laterally from the elongated signal conductor strip 17. The bulging portion 20 is sized and positioned along the elongated signal conductor strip 17 so as to be capable of having a capacitance so as to establish a desired impedance for the via structure 18. For example, a capacitance may be selected for the bulging portion 20 to establish an impedance of 50 ohms for the via structure 18.

The elongated signal conductor strip 17 extends to form a signal trace portion 14 routed along the printed circuit board 10. The signal trace portion 14 typically has at least one corresponding return or ground (not shown in FIG. 1).

The capacitance of the bulging portion 20 may be selected so that in combination with the conductive pad 30 and the signal via 24, the via structure 18 has a predetermined impedance. For example, the predetermined impedance of the via structure 18 may be approximately 33 ohms, 50 ohms, 75 ohms, 100 ohms, etc., or other values as desired. The impedance of the signal trace portion 14 may be approximately the same as the impedance of the via structure 18.

In some embodiments, matching the predetermined impedance of the via structure 18 with the predetermined impedance of the signal trace portion 14 may allow a high frequency signal (e.g., a signal having a frequency above 1 GHz) to propagate through the via structure 18 and may maintain the fidelity of the signal. Consequently, the signal trace portion 14 may be routed as a strip line, which may increase the routing density of the printed circuit board 10 in comparison to a signal trace portion 14 routed as a micro strip.

The printed circuit board 10 may include one or more ground vias 16 passing through the layer 12 of the printed circuit board 10, which function as an electrical ground reference or signal return for the printed circuit board 10. As shown in FIG. 1, the ground vias 16 are generally located outside a keep out 22 (shown with phantom line) surrounding the conductive pad 30, which may be a circular area substantially concentric with the signal via 24. The ground vias 16 are generally positioned outside the keep out 22 because the ground vias 16 may affect the inductance or a capacitance of the signal via 24. For example, the capacitance of the signal via 24 may increase as one of the ground vias 16 is positioned closer to the signal via 24. In other embodiments, the ground vias 16 may be partially inside the keep out 22. The size of the keep out 22 is selected such that the signal via 24 is inductive. For example, the signal via 24 may have a greater inductive reactance than a capacitive reactance for a high frequency signal, such as a signal having a frequency above 1 GHz.

The conductive pad 30, the elongated signal conductor strip 17, and the signal trace portion 14, or any combination thereof, may be portions of an integrated conductor formed on the layer 12 of the printed circuit board, for example by using a metal deposition/plating and etch process. The conductive pad 30, the elongated signal conductor strip 17, and the signal trace portion 14 may be composed of a metal such as copper. For example, the conductive pad 30, the elongated signal conductor strip 17, and the signal trace portion 14 may be part of a copper foil on the printed circuit board 10. The signal via 24 may also be composed of a metal such as copper.

The conductive pad 30 and the elongated conductor strip 17 may be integrally formed on the layer 12, for example by using a metal deposition/plating and etch process. The signal via 24 may be formed by drilling a hole though the layer 12 and by using a metal deposition process to plate or fill the hole such that the signal via 24 is electrically connected to the conductive pad 30.

Figure 2:
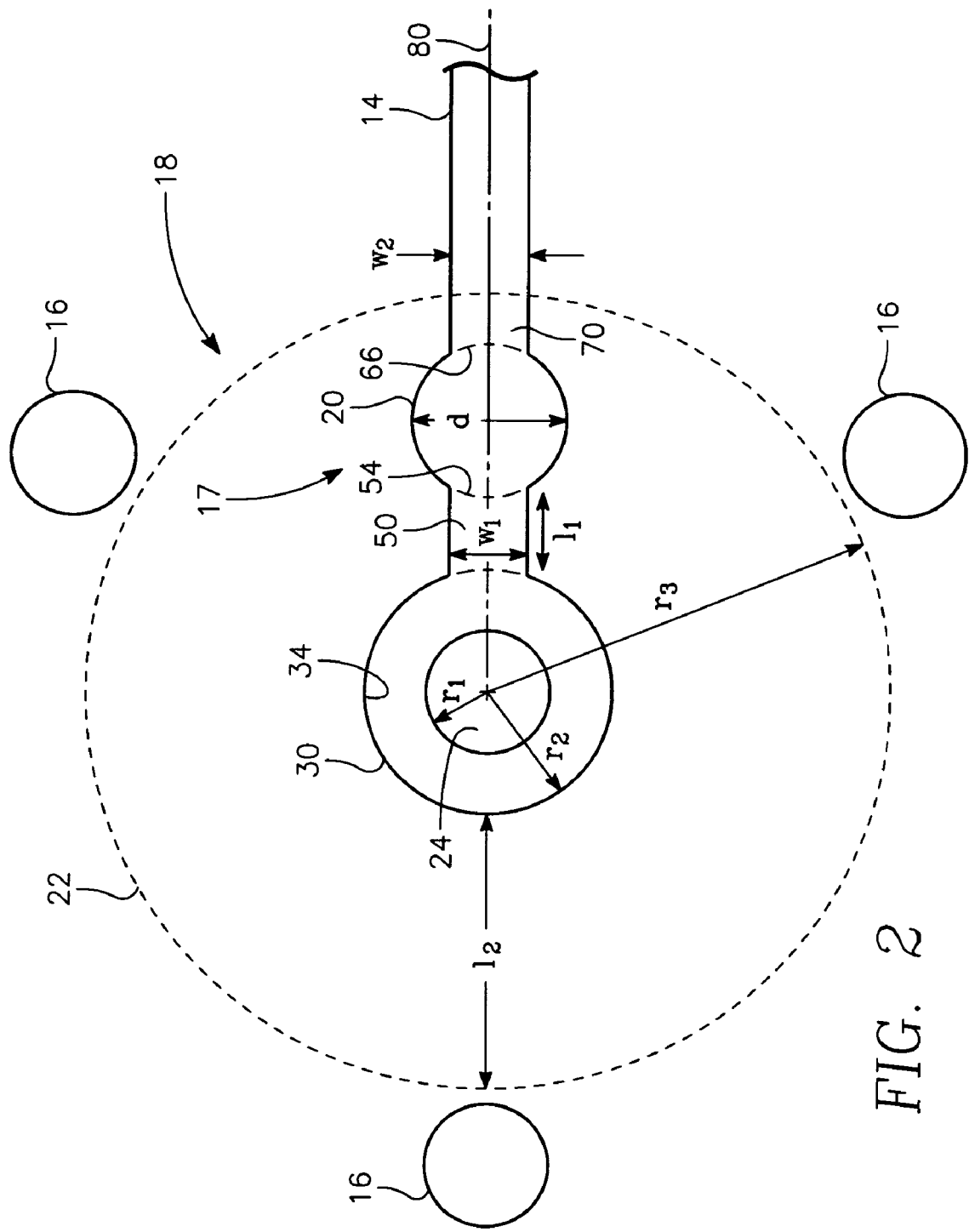
FIG. 2 is a block diagram of one embodiment of the via structure.

FIG. 2 depicts a block diagram of one embodiment of the via structure 18. The signal via 24 may have a substantially circular shape defined by a radius $r_1$. The conductive pad 30 may be defined by an inner radius $r_1$ and an outer radius $r_2$, and may have an outer edge 34 defined by the outer radius $r_2$. The keep out 22 may have a substantially circular shape defined by a radius $r_3$ which is greater than the outer radius $r_2$ of the conductive pad 30. For example, the keep out 22 may be a circle defined by the radius $r_3$ and have a distance $l_2$ between the outer edge 34 of the conductive pad 30 and the circle. The signal via 24, the conductive pad 30, and the keep out 22 may be substantially concentric, but this is not necessary.

In the embodiment of FIG. 2, the elongated signal conductor strip 17 extends from the conductive pad 30 and includes a neck portion 50 that extends from the outer edge 34 of the conductive pad 30 to a proximal end 54 of the bulging portion 20. The neck portion 50 extends longitudinally along an axis 80 and separates the signal via 24 from the bulging portion 20. In this way, the bulging portion 20 may not significantly affect the capacitance of the signal via 24 for high frequency signals (e.g., a signal having a frequency above 1 GHz) such that the signal via 24 remains intrinsically inductive. In one embodiment as shown in FIG. 2, the neck portion 50 has a substantially rectangular shape defined by a length $l_1$ along the axis 80 and a width $w_1$ perpendicular to the axis 80. The length $l_1$ extends between the outer edge 34 of the conductive pad 30 and the proximal end 54 (shown in phantom line) of the bulging portion 20.

In various embodiments, the bulging portion 20 may have a geometric shape that bulges and/or protrudes laterally outward from the axis 80 past the neck portion 50. For example, the bulging portion 20 may have arcuate protrusions as shown in FIG. 2. The arcuate protrusions of the bulging portion 20 may extend a distance d from side-to-side, which is greater than the width $w_1$ of the neck portion 50. For example, the width $w_1$ of the neck portion 50 may be 0.025 inches and the distance d of the bulging portion 20 may be 0.035 inches. The bulging portion 20 may be connected to the signal trace portion 14 by way of a connecting portion 70, which is interposed between the bulging portion 20 and the signal trace portion 14 (as shown in FIG. 2). Or, the bulging portion 20 may be connected directly (not shown) to the signal trace portion 14. In one embodiment as shown in FIG. 2, the bulging portion 20 is located midway between the outer edge 34 of the conductive pad 30 and an outer edge $r_3$ of the keep out 22, at a midpoint of elongated signal conductor strip 17 located within the keep out 22.

In some embodiments, the bulging portion 20 has lateral curved shape bulge(s) and/or protrusion(s). In some embodiments, arcuate shaped portions, which may be opposing semi-circular portions, bulge and/or protrude laterally outward from the axis 80 as shown in FIG. 2. Other shaped protrusions are possible.

As shown in FIG. 2, in some embodiments the via structure 18 includes a connecting portion 70 within the keep out 22, extending from the bulging portion 20. The connecting portion 70 may have a substantially rectangular shape between a distal end 66 (shown in phantom line) of the bulging portion 20 and the keep out 22. The width of the connecting portion 70 may be less than the distance d of the bulging portion 20 and may be the same as a width $w_2$ of the signal trace portion 14. For example, the width of the connecting portion 70 may be 0.025 inches.

Although the bulging portion 20 shown with substantially arcuate shape protrusions, the bulging portion 20 may have any geometric shape such that bulging portion 20 has a capacitance to establish the predetermined impedance for the via structure 18. For example, the bulging portion 20 may have a polygonal shape, such as a diamond shape. The geometric shape of the bulging portion 20 need not be symmetric and may be an irregular shape. Further, a shape of the bulging portion 20 may be defined by a length extending along the axis 80 between the proximal end 54 and the distal end 66, and a width perpendicular to the axis 80.

Figure 3:
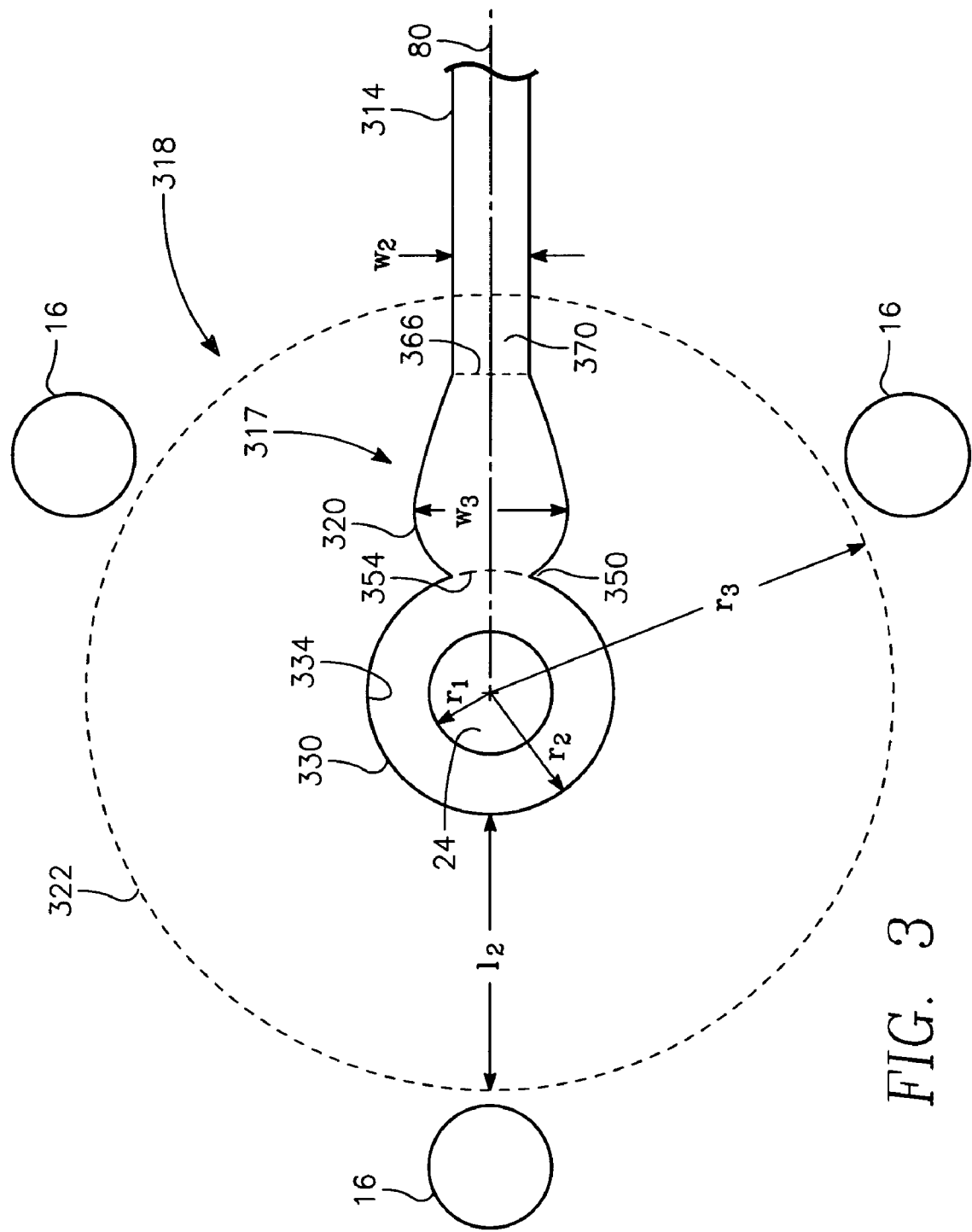
FIG. 3 is a block diagram of one embodiment of the via structure.

FIG. 3 depicts a block diagram of an embodiment of a via structure 318. In the embodiment of FIG. 3, the bulging portion 320 protrudes outward to a distance $w_3$ along a curve extending from the neck portion 350 and tapers to a width $w_2$ at a distal end 366 of the bulging portion 320. In other embodiments (not shown) the bulging portion 320 may protrude outward along a straight line, which may taper, or extend perpendicularly away from the axis 80. As in the embodiment of FIG. 2, the width of the neck portion 350 may vary, but is less than the distance $w_3$ of the bulging portion 320. Also, as is evident in FIG. 3, the length of the neck portion 350, depicted as $l_1$ in FIG. 2, can vary, and may be reduced to or near zero as shown in FIG. 3. As shown in FIG. 3, the bulging portion 320 may have substantially a convex shape or a convex outer surface, as viewed from outside the bulging portion 320.

A connecting portion 370 within the keep out 322 is shown connecting the bulging portion 320 at a distal side 366 to the signal trace portion 314. In other embodiments, it is possible to extend the bulging portion 320 to the edge of the keep out 322, or beyond.

In some embodiments not shown, the conductive pad and the bulging portion together have generally a teardrop shape with slits, or other cutouts forming the neck portion between the conductive pad and the bulging portion.

Figure 4:
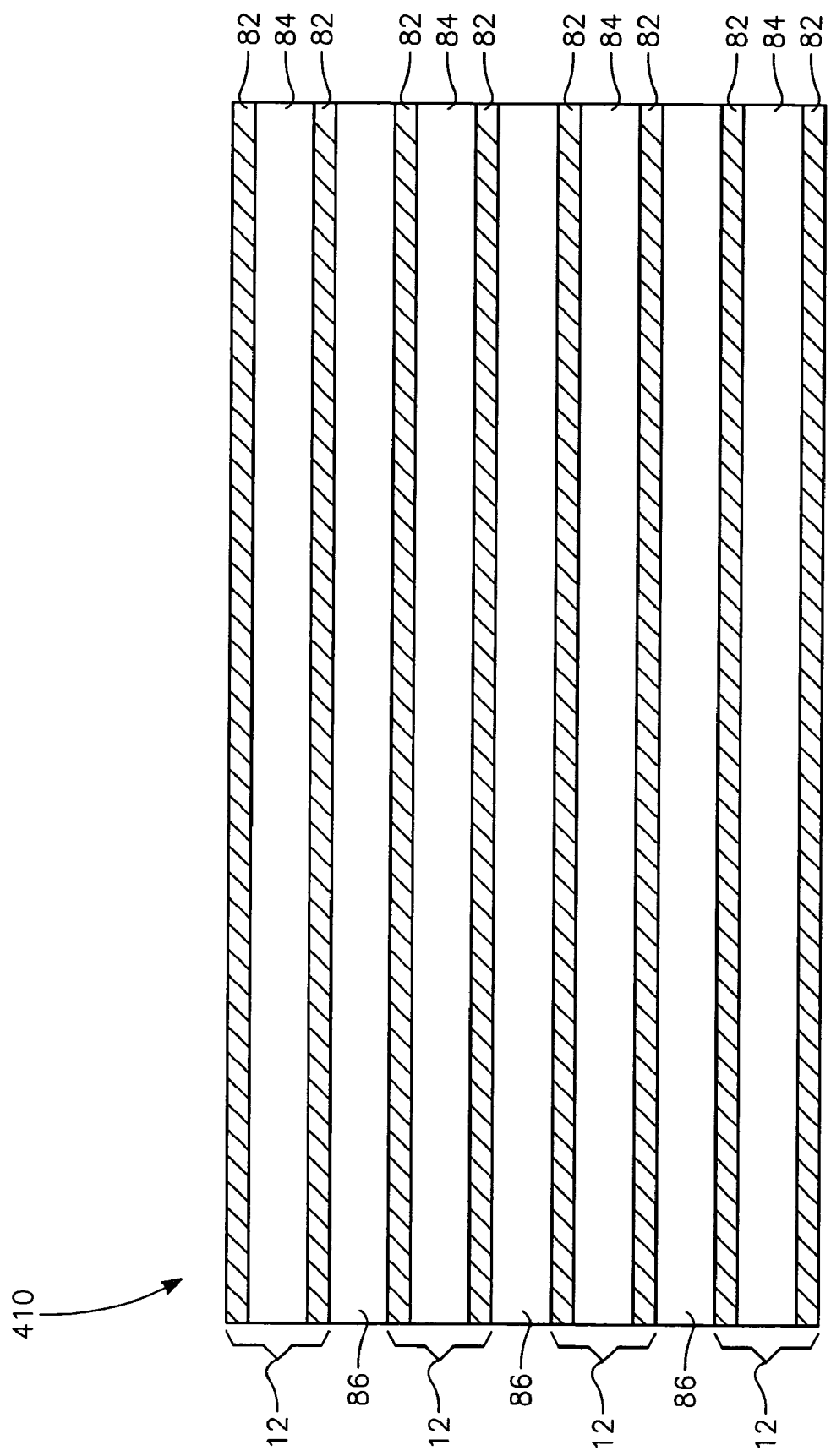
FIG. 4 is a cross-sectional view of a multilayer printed circuit board.

FIG. 4 depicts a cross-sectional view of a portion of a multilayer printed circuit board 410. The multilayer printed circuit board 410 may be formed by joining individual printed circuit boards 12, each have a core 84 and opposing conductor layers 82 on either side of the core 84, with prepreg layers 86. In some embodiments (not shown), several layers of prepreg may sandwich a conductor layer, such as conductive foil, between the conductor layers 82 on adjacent cores 84, as is known in the art. Other arrangements are possible.

Although only eight conductor layers 82 are shown in FIG. 4, the printed circuit board 410 may have additional or fewer conductor layers 82. The conductive layers 82 are shown as solid layers for illustration purposes. The conductive layers 82 may include conductor planes, traces, via structures, etc.

Figure 5:
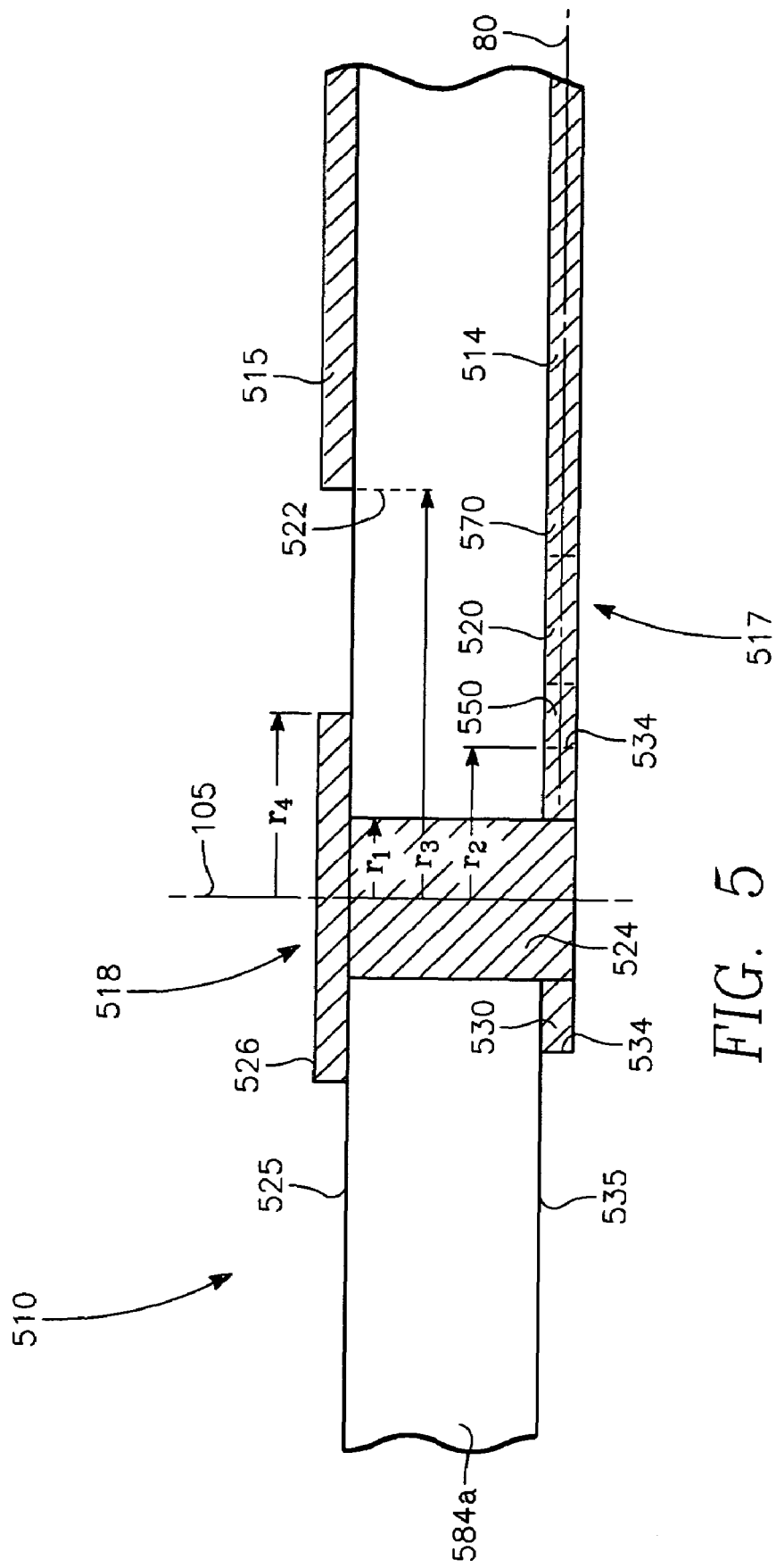
FIG. 5 is a cross-sectional view of one embodiment of a printed circuit board including the via structure.

FIG. 5 depicts a cross-sectional view of a single core 584a printed circuit board 510 including a via structure 518 in accordance with a potential embodiment of the present invention. The printed circuit board 510 may be part of a multilayer board (not shown in FIG. 5). The signal via 524 of the via structure 518, passes through the core 584a to connect through the conductive pad 530, the neck portion 550, the bulging portion 520, and the connecting portion 570, to the signal trace portion 514.

The printed circuit board 510 includes a ground conductor 515, which may be a ground trace or a ground plane. As shown in FIG. 5, the ground conductor 515 is outside the keep out 522, but may have a proximal end that extends to the keep out 522. Thus, the keep out 522 represents and area generally free of ground conductor 515.

As shown in FIG. 5, the ground conductor 515 is adjacent to the signal trace portion 514. The section of the signal conductor strip connected between the signal via 524 and the signal trace portion 514, however, extends without a corresponding adjacent ground conductor 515 through the keep out 522 to connect the signal via 524 with the signal trace portion 514.

In one embodiment, the ground conductor 515 is a trace substantially parallel to the signal trace portion 514 and has a pattern that is similar to the pattern of the signal trace portion 514. In another embodiment, the ground conductor 515 is a ground plane. In this embodiment, the signal trace portion 514 in combination with the ground conductor 515 form a micro strip signal trace portion 514 on the printed circuit board 510.

The bulging portion 520 may be sized and positioned along the elongated signal conductor strip 517 so as to be capable of capacitive coupling, i.e., by fringing capacitance, between the bulging portion 520 and the ground conductor 515. The capacitance of the bulging portion 520 is based on the size and shape of the bulging portion 520, the material of the bulging portion 520, and material of the core 584a layers (or other between layer(s) not shown). Additionally, the capacitance of the bulging portion 520 is based on the distance between the bulging portion 520 and the signal via 524, the keep out distance $r_3$ and the number of adjacent ground conductors. In one embodiment, the capacitance of the bulging portion 520 is mostly attributed to the capacitance between the bulging portion 520 and the ground conductor 515. The bulging portion 520 of the elongated signal conductor strip 517 shown in FIG. 5 is located substantially midway between a proximal end of the ground conductor 515 positioned at the keep out 522 and the outer edge 534 of the conductive pad 530.

In one embodiment, the signal via 524 includes an optional contact pad 526 on the top surface 525 of the printed circuit board 510. The contact pad 526 may provide an interface between the printed circuit board 510 and an electrical circuit external to the printed circuit board 510. In this way, signals may be transmitted between the signal via 524 and the electrical circuit through the contact pad 526. For example, the printed circuit board 510 may be part of a device interface board (DIB), a probe interface board (PIB), or a handler interface board (HIB). The electrical circuit may include a pogo pin or an interposer of an apparatus for testing semiconductor devices. The contact pad 526 may be a surface mount technology (SMT) pad for electrically connecting the signal via 524 to an SMT connector.

Figure 6:
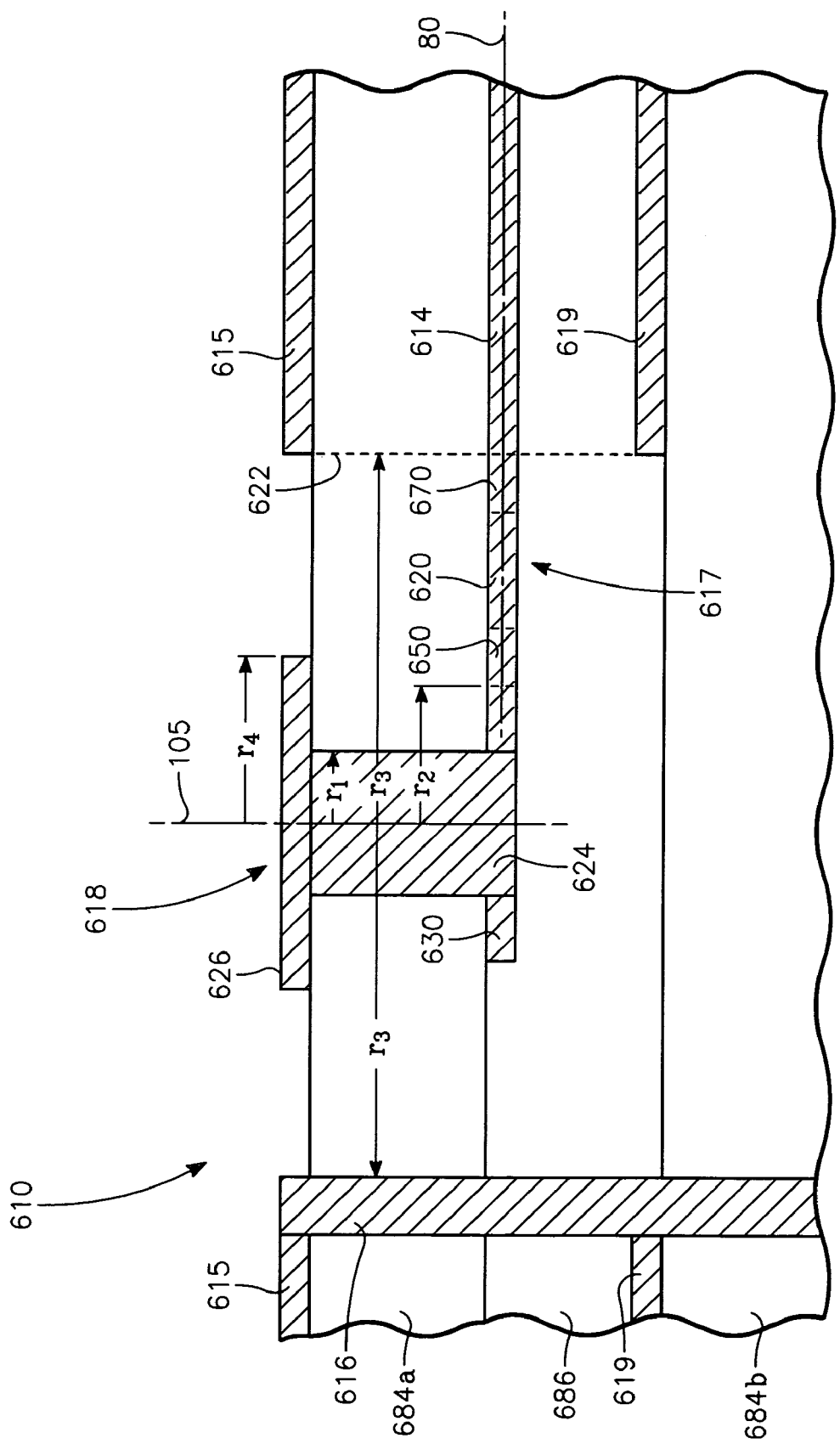
FIG. 6 is a cross-sectional view of another embodiment of the printed circuit board including the via structure.

FIG. 6 depicts a cross-sectional view of a portion of a printed circuit board 610 in accordance with another embodiment of the present invention. A signal via structure 618 has a signal via 624 passing through the core 684a to connect through the conductive pad 630, the neck portion 650, the bulging portion 620, and the connecting portion 670, to a signal trace portion 614.

In the embodiment of FIG. 6, two ground conductors 615 and 619 are provided for the signal trace portion 614 of the elongated signal conductor strip 617. The ground conductors 615 and 619 are outside the keep out 622 but may have a proximal end that extends to the keep out 622. The signal trace portion 614 having opposing ground conductors 615 and 619 on either side, as illustrated in FIG. 6, is sometimes referred to as a strip line signal conductor.

The bulging portion 620 is sized and positioned along the elongated signal conductor strip 617 so as to be capable of having a fringing capacitance with the ground conductors 615 and 619. In various embodiments, the ground conductors 615 and 619 may be ground planes and/or ground traces as discussed above. In an embodiment that includes the optional contact pad 626, the bulging portion 620 may also have fringing capacitance with the contact pad 626 as discussed above.

The printed circuit board 610 may be part of a multilayer laminated printed circuit board (not shown in FIG. 6). A ground via 616 is shown extending through the core 684a and a prepreg layer 686 to electrically connect the ground conductors 615 and 619. The ground via 616 is shown extending through a core 684b and may extend to contact other ground conductors (not shown), if desired. Other embodiments are possible.

The via structures and the printed circuit board discussed above may be modeled and simulated using a three-dimensional circuit emulation program. An example of such a three-dimensional circuit emulation program is the High Frequency Structure Simulator (HFSS) available from Ansoft Corp., of Pittsburg, Pa., www.ansoft.com.

In this way, capacitance of the bulging portion may be determined so as to establish a predetermined impedance of the signal via structure based on a selected configuration and materials. Thus, the bulging portion may be configured to have a capacitance to provide a selected impedance for the signal via structure. Moreover, a printed circuit board may be manufactured to have multiple signal via structures, each having a bulging portion customized for the characteristic of its associated signal via so as to establish a proper impedance for each signal via structure.

Figure 7:
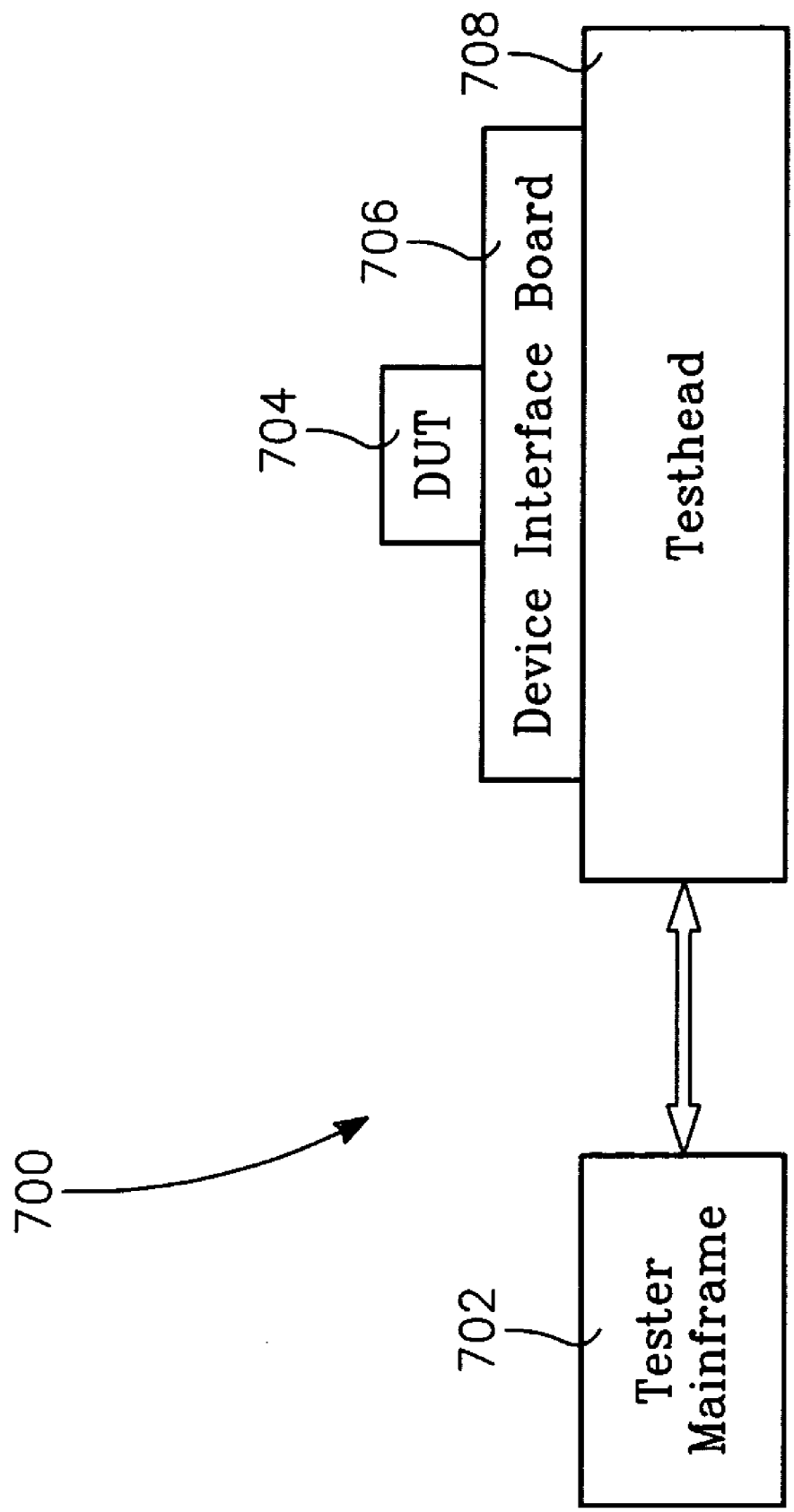
FIG. 7 is a block diagram of one embodiment of a tester including a via structure.

FIG. 7 is a block diagram of one embodiment of a tester 700 which may include the via structure (not shown). The tester 700 includes a tester mainframe 702 coupled in communication with a test head 708 and an interface board 706 associated with test head 708, which may be coupled to the test head 708. In the embodiment shown in FIG. 7, the interface board 706 is a device interface board. In operation, the interface board 706 is electrically coupled to a device under test (DUT) 704 for testing the DUT 704. For example, the tester 700 may be an automated test equipment (ATE) system for testing integrated circuits, and the DUT 704 may be a semiconductor device including an integrated circuit. The interface board 706 may be, or include the printed circuit board 10 (FIG. 1, 4, 5, or 6).

The tester mainframe 702 includes circuitry for generating test signals and evaluating test signals. The tester mainframe 702 sends test signals to the DUT 704 and receives test signals from the DUT 704 through the test head 708 and the interface board 706. The DUT 704 may be a packaged silicon die including an integrated circuit to be tested. In another embodiment, the interface board 706 is a probe interface board, and the DUT 704 may be a semiconductor wafer including an integrated circuit to be tested.

In various embodiments, the interface board 706 and/or the test head 708 may include a multilayer printed circuit board including signal via structures as discussed above.

The embodiments described herein are illustrative of the present invention. As these embodiments of the present invention are described with reference to illustrations, various modifications or adaptations of the methods and/or specific structures described may become apparent to those skilled in the art. All such modifications, adaptations, or variations that rely upon the teachings of the present invention, and through which these teachings have advanced the art, are considered to be within the spirit and scope of the present invention. Hence, these descriptions and drawings should not be considered in a limiting sense, as it is to be understood that the present invention is not limited to only the embodiments illustrated.

What is claimed is:

1. A via structure for a printed circuit board, comprising:
    a signal via; and
    an elongated signal conductor strip in connection with the signal via, the elongated signal conductor strip comprising a proximal section extending away from the signal via without an adjacent ground conductor and a distal section with a ground conductor adjacent thereto, wherein the proximal section extends away along an axis and comprises an outward curving portion bulging laterally outward from the axis such that the outward curving portion capacitively couples by fringing capacitance with the ground conductor adjacent to the distal section of the elongated signal conductor strip.

2. The via structure of claim 1 further comprising ground vias spaced about the signal via.

3. The via structure of claim 1, wherein the bulging portion further comprises arcuate portions located on opposing sides of the axis.

4. The via structure of claim 1, wherein the bulging portion comprises at least one of: (a) a semicircular shape; or (b) a taper shape.

5. The via structure of claim 1, wherein the bulging portion is located at a midpoint of the proximal section.

6. The via structure of claim 1, wherein the bulging portion comprises a peripheral edge extending laterally outward from the axis and in a direction away from the signal via near the signal via and tapering toward the axis distal from the signal via.

7. The via structure of claim 1, wherein the bulging portion has a substantially convex outer surface.

8. The via structure of claim 1, wherein the bulging portion is sized and positioned along the elongated signal conductor strip so as to be capable of having a capacitance to establish a predetermined impedance of the via structure.

9. The via structure of claim 1, wherein the proximal section comprises a neck portion between the signal via and the bulging portion.

10. The via structure of claim 1, wherein the proximal section comprises a connecting portion adjacent to the bulging portion at a side of the bulging portion opposite the signal via.

11. The via structure of claim 1, wherein the bulging portion is confined within the proximal section without the adjacent ground conductor.

12. A via structure for a printed circuit board, the via structure comprising:
    a signal via;
    a conductive pad electrically connected to the signal via;
    at least one ground conductor being positioned a keep out distance away from the conductive pad; and
    an elongated signal conductor strip extending longitudinally along an axis from the conductive pad to adjacent the at least one ground conductor and comprising an outward curving portion protruding laterally outward from the axis, the outward protruding portion being located within the keep out distance such that the outward curving portion capacitively couples with the at least one ground conductor by fringing capacitance.

13. The via structure of claim 12, wherein the outward protruding portion comprises at least one of: (a) a semicircular shape; or (b) a taper shape.

14. The via structure of claim 12, wherein the outward protruding portion comprises arcuate shaped portions located on opposing sides of the axis.

15. The via structure of claim 12, wherein the outward protruding portion is located substantially midway within an interval defined by an outer edge of the conductive pad and a proximate edge of the at least one ground conductor.

16. The via structure of claim 12, wherein the outward protruding portion is sized and positioned along the elongated signal conductor strip so as to be capable of having a capacitance to establish a predetermined impedance of the via structure.

17. The via structure of claim 16, wherein the predetermined impedance of the via structure is one of (a) about 33 ohms; (b) about 50 ohms; (c) about 75 ohms; or (d) about 100 ohms.

18. The via structure of claim 12 further comprising ground vias located about the signal vias, and wherein at least one of the ground vias is connected to the at least one ground conductor and is positioned at one of: (a) partially within the keep out distance; or (b) outside of the keep out distance.

19. The via structure of claim 12, wherein the elongated signal conductor strip comprises a neck portion between the signal via and the outward protruding portion.

20. The via structure of claim 12, wherein the elongated signal conductor strip comprises a connecting portion adjacent the outward protruding portion at a side of the outward protruding portion opposite the signal via.

21. The via structure of claim 12, wherein the conductive pad and the outward protruding portion have a generally teardrop shape comprising a neck portion between the conductive pad and the outward protruding portion.

22. The via structure of claim 12, wherein the laterally protruding portion is confined within the keep out distance.

23. A printed circuit board comprising:
a first layer including a first ground conductor;
a second layer including a signal trace; and
a via structure electrically connected to the signal trace, the via structure comprising:
  a signal via extending at least partially through the second layer;
  a conductive pad in the second layer, the conductive pad electrically connected to the signal via; and
  an elongated signal conductor strip in the second layer, the elongated signal conductor strip extending from the conductive pad longitudinally along an axis and comprising an outward curving portion protruding laterally outward from the axis such that the outward curving portion capacitively couples with the first ground conductor by fringing capacitance, the outward protruding portion being configured so as to have a capacitance to establish a predetermined impedance of the via structure; and
at least one ground via located about the signal via and positioned at a keep out distance away from the signal via, the at least one ground via electrically connected to the first ground conductor.

24. The printed circuit board of claim 23, wherein the outward protruding portion comprises:
a first portion protruding laterally outward from the axis; and
a second portion opposing the first portion and protruding laterally outward from the axis.

25. The printed circuit board of claim 23, wherein the outward protruding portion has at least one of: (a) a semicircular shape; or (b) a taper shape.

26. The printed circuit board of claim 23, wherein the outward protruding portion is located approximately midway within an interval defined by an outer edge of the conductive pad and a proximate edge of the first ground conductor.

27. The printed circuit board of claim 23, wherein the signal trace comprises a predetermined impedance, and wherein the predetermined impedance of the via structure is approximately equal to the predetermined impedance of the signal trace.

28. The printed circuit board of claim 23, wherein the predetermined impedance of the via structure is one of: (a) in a range of from about 48 ohms to about 52 ohms; (b) approximately 75 ohms; or (c) approximately 100 ohms.

29. The printed circuit board of claim 23, wherein the first ground conductor is a ground plane.

30. The printed circuit board of claim 23 further comprising a third layer comprising a second ground conductor, the second ground conductor electrically connected to the first ground conductor, wherein the outward protruding portion is further sized and positioned along the elongated signal conductor strip so as to be capable of capacitive coupling with the second ground conductor.

31. The printed circuit board of claim 23, wherein the elongated signal conductor strip further comprises a neck portion between the signal via and the outward protruding portion.

32. The printed circuit board of claim 23, wherein the elongated signal conductor strip comprises a connecting portion between the outward protruding portion and the signal trace.

33. The via structure of claim 23, wherein the laterally protruding portion is confined within the keep out distance.

34. An apparatus for testing a device under test, comprising:
a tester mainframe;
a test head coupled to the tester mainframe; and
a printed circuit board configured to mate with the test head, the printed circuit board comprising:
  a first layer including a first ground conductor;
  a second layer including a signal trace; and
  a via structure extending at least part way through the printed circuit board and electrically connecting to the signal trace, the via structure comprising:
    a signal via extending at least part way through the printed circuit board;
    a conductive pad in the second layer, the conductive pad electrically connected to the signal via; and
    an elongated signal conductor strip in the second layer, the elongated signal conductor strip extending from the conductive pad longitudinally along an axis and comprising an outward curving portion located within a keep out distance from the first ground conductor and protruding laterally outward from the axis such that the outward curving portion capacitively couples with an adjacent ground conductor by fringing capacitance, the outward protruding portion being configured so as to have a capacitance to establish a predetermined impedance of the via structure.

35. The apparatus of claim 34, wherein the printed circuit board is one of: (a) a device interface board, (b) a probe interface board, or (c) a handler interface board.

36. The apparatus of claim 34, wherein the elongated signal conductor strip comprises a neck portion between signal via and the outward protruding portion.

37. A printed circuit board comprising:
a first layer including a first ground conductor;
a second layer including a signal trace; and
a via structure electrically connected to the signal trace, the via structure comprising:
  a signal via extending at least partially through the second layer;
  a conductive pad in the second layer, the conductive pad electrically connected to the signal via; and
  an elongated signal conductor strip in the second layer, the elongated signal conductor strip extending from the conductive pad longitudinally along an axis and comprising a portion protruding laterally outward from the axis, the outward protruding portion being configured so as to have a capacitance to establish a predetermined impedance of the via structure;
at least one ground via located about the signal via and positioned at a keep out distance away from the signal via, the at least one ground via electrically connected to the first ground conductor; and
the signal via comprises a radius of approximately 0.0125 inches, the conductive pad comprises an outer radius of approximately 0.0175 inches, and the outward protruding portion comprises semi-circular portions each comprising a radius of approximately 0.0125 inches.

38. A via structure for a printed circuit board, comprising:
a signal via;
an elongated signal conductor strip in connection with the signal via, the elongated signal conductor strip comprising a proximal section extending away from the signal via without an adjacent ground conductor, wherein the proximal section extends away along an axis and comprises an outward curving portion bulging laterally outward from the axis; and
the proximal section extending away from the signal via without an adjacent ground conductor comprising a connecting portion adjacent to the bulging portion at a side of the bulging portion opposite the signal via such that the outward curving portion capacitively couples by fringing capacitance with a ground conductor adjacent to a distal section of the elongated signal conductor strip.

* * * * *